(12) United States Patent
Chen

(10) Patent No.: US 12,101,986 B2
(45) Date of Patent: Sep. 24, 2024

(54) ORGANIC LIGHT-EMITTING DIODE DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Lixuan Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 522 days.

(21) Appl. No.: 17/419,719

(22) PCT Filed: May 25, 2021

(86) PCT No.: PCT/CN2021/095692
§ 371 (c)(1),
(2) Date: Jun. 30, 2021

(87) PCT Pub. No.: WO2022/151628
PCT Pub. Date: Jul. 21, 2022

(65) Prior Publication Data
US 2023/0157139 A1    May 18, 2023

(30) Foreign Application Priority Data
Jan. 18, 2021  (CN) .......................... 202110061125.5

(51) Int. Cl.
H10K 59/80    (2023.01)
H10K 59/38    (2023.01)
H10K 59/12    (2023.01)

(52) U.S. Cl.
CPC ......... *H10K 59/8792* (2023.02); *H10K 59/38* (2023.02); *H10K 59/12* (2023.02)

(58) Field of Classification Search
CPC ........ H10K 59/38; H10K 59/12; H10K 59/35; H10K 59/8792; H10K 50/865
See application file for complete search history.

(56) References Cited

U.S. PATENT DOCUMENTS 6,545,653 B1 *  4/2003  Takahara .......... G02F 1/133512
                                              348/448
7,385,347 B2    6/2008  Song et al.
(Continued)

FOREIGN PATENT DOCUMENTS

CN    102468322 A    5/2012
CN    204271086 U    4/2015
(Continued)

OTHER PUBLICATIONS

Chinese Office Action issued in corresponding Chinese Patent Application No. 202110061125.5 dated Jan. 25, 2022, pp. 1-7.
(Continued)

*Primary Examiner* — Victor A Mandala
*Assistant Examiner* — Lawrence C Tynes, Jr.
(74) *Attorney, Agent, or Firm* — PV IP PC; Wei Te Chung

(57) ABSTRACT

The present application provides an organic light-emitting diode (OLED) display panel, wherein the OLED display panel includes: a substrate; an organic light-emitting layer disposed on the substrate, and provided with a plurality of organic light-emitting monomers; a color filter layer disposed on a side of the organic light-emitting layer facing toward a light-exiting direction; and a light-absorbing material layer disposed on the side of the organic light-emitting layer facing toward the light-exiting direction.

20 Claims, 2 Drawing Sheets

(56) References Cited

U.S. PATENT DOCUMENTS

| | | | |
|---|---|---|---|
| 2012/0187386 A1* | 7/2012 | Matsumi | H10K 50/11 |
| | | | 257/E51.026 |
| 2016/0285049 A1 | 9/2016 | Song et al. | |
| 2016/0372528 A1* | 12/2016 | Kamura | H01L 31/055 |
| 2017/0179202 A1* | 6/2017 | Choi | H10K 50/865 |
| 2020/0075864 A1* | 3/2020 | Helander | H10K 50/824 |
| 2020/0343315 A1* | 10/2020 | Lin | H10K 59/8792 |
| 2021/0020699 A1* | 1/2021 | Yoshimura | H05B 33/14 |
| 2021/0028272 A1* | 1/2021 | Won | H10K 59/1315 |

FOREIGN PATENT DOCUMENTS

| | | |
|---|---|---|
| CN | 107195797 A | 9/2017 |
| CN | 108899354 A | 11/2018 |
| CN | 110047890 A | 7/2019 |
| CN | 110085762 A | 8/2019 |
| CN | 110473900 A | 11/2019 |
| CN | 111430423 A | 7/2020 |
| CN | 112420955 A | 2/2021 |
| CN | 112635694 A | 4/2021 |
| IN | 111458923 A | 7/2020 |

OTHER PUBLICATIONS

International Search Report in International application No. PCT/CN2021/095692, mailed on Oct. 15, 2021.
Written Opinion of the International Searching Authority in International application No. PCT/CN2021/095692, mailed on Oct. 15, 2021.

* cited by examiner

ORGANIC LIGHT-EMITTING DIODE DISPLAY PANEL

RELATED APPLICATIONS

This application is a National Phase of PCT Patent Application No. PCT/CN2021/095692 having international filing date of May 25, 2021, which claims the benefit of priority of Chinese Patent Application No. 202110061125.5 filed on Jan. 18, 2021. The contents of the above applications are all incorporated by reference as if fully set forth herein in their entirety.

BACKGROUND OF INVENTION

Field of Invention

The present application relates to the field of display technology, and in particular to an organic light-emitting diode (OLED) display panel.

Description of Prior Art

OLED displays have a wide range of advantages, such as high color gamut, good viewing angles, and fast response times. However, OLED displays also have some shortcomings of their own. For example, OLED displays have lower brightness and poorer stability than other displays.

On the other hand, for an organic light-emitting diode (OLED) display based on an inkjet printing process, there is a risk of color shift at certain viewing angles, due to a microcavity effect of organic light-emitting monomers of red/green/blue sub-pixels of the OLED display. In order to improve the viewing angles and brightness of the OLED, many improvement methods have been proposed. For example, adding optical microstructures (such as microlens arrays, gratings, etc.) on a light-exiting surface, or adding a refractive index matching layer between light-exiting interfaces. These methods have a certain effect, but feasibility of mass production is not high.

In one technology, a solution for adding scattering particles to a thin film encapsulation (TFE) layer is proposed. This solution has its own unique advantages, such as simple manufacturing process, no need for patterning, and controllable particles. However, there are also problems. A tetrafluoroethylene layer is a functional layer that acts as thin film encapsulation to insulate water and oxygen. When the scattering particles are mixed, portions of the TFE layer may penetrate up and down locally due to uneven dispersion or other reasons, which impacts encapsulation effect. On the other hand, due to strong reflection of the OLED display, it is necessary to attach a circular polarizer to a surface of the OLED display, thereby greatly reducing the reflectivity of ambient light. However, the circular polarizer will cause an efficiency of emitted light to be reduced by more than 50%, which is a key factor of affecting brightness of the OLED display device. Meanwhile, a thickness of the circular polarizer itself is often more than 100 microns, and it is attached to an outer side of the OLED display device, which is not conducive to curling, flexibility, and folding functions of the OLED display device.

In order to resolve the above problems, the industry has begun to use RGB color filters combined with a thin anti-reflective (AR) film to remove a polarizing film. However, because an anode of the OLED display has a very strong reflectivity, the color filters cannot completely filter out reflected light from the anode, resulting in a reflectivity maintained at about 10%. Such reflectivity will exhibit a poor visual effect even in places where the ambient light is slightly strong.

Referring to FIG. 1. FIG. 1 is a schematic diagram of a structure of an organic light-emitting diode (OLED) display panel in the prior art. As shown in FIG. 1, since a light transmittance of a color filter layer 100 is generally high, when the color filter layer 100 is used to reduce the reflected light, the effect of reducing the reflected light that can be achieved depends on a degree of light absorption of the color filter layer 100. Further, referring to FIG. 2, FIG. 2 is a spectrum diagram of the transmitted light of the color filter layer in the prior art. As shown in FIG. 2, light transmittance of the color filter layer 100 at peaks of a green light band, a blue light band, and a red light band is above 80%, so round-trip transmission of reflected light can be simply calculated as T=0.8*0.8*anode reflection. which is still very large.

Therefore, the existing technology has shortcomings and urgently needs improvement.

SUMMARY OF INVENTION

An object of embodiments of the present application is to provide an organic light-emitting diode (OLED) display panel, wherein by adopting a light-absorbing material layer in a light-exiting direction of the organic light-emitting layer to filter out reflected light of an anode metal layer of the organic light-emitting layer, a poor visual effect can be prevented even in places where ambient light is slightly strong, thereby improving user's experience.

An embodiment of the present application provides an organic light-emitting diode (OLED) display panel, which includes:

a substrate;

an organic light-emitting layer disposed on the substrate, and provided with a plurality of organic light-emitting monomers;

a color filter layer disposed on a side of the organic light-emitting layer facing toward a light-exiting direction; and a light-absorbing material layer disposed on the side of the organic light-emitting layer facing toward a light-exiting direction.

In the OLED display panel described in an embodiment of the present application, the organic light-emitting layer includes a cathode metal layer, an anode metal layer, and a light-emitting layer located between the cathode metal layer and the anode metal layer; the light-emitting layer is formed of the plurality of organic light-emitting monomers; and the light-emitting layer emits light toward a side away from the substrate; and wherein the color filter layer is disposed on a side of the cathode metal layer away from the substrate, and the light-absorbing material layer is disposed on a side of the color filter layer away from the substrate.

In the OLED display panel described in an embodiment of the present application, the organic light-emitting layer includes a cathode metal layer, an anode metal layer, and a light-emitting layer located between the cathode metal layer and the anode metal layer; the light-emitting layer is formed of the plurality of organic light-emitting monomers; and the light-emitting layer emits light toward a side close to the substrate; and wherein the color filter layer is disposed on a side of the anode metal layer close to the substrate, and the light-absorbing material layer is disposed on a side of the color filter layer close to the substrate.

In the OLED display panel described in an embodiment of the present application, the light-absorbing material layer includes a plurality of pixel areas corresponding to the plurality of organic light-emitting monomers; and a thickness of the light-absorbing material layer in the pixel areas is 50 nanometers to 2000 nanometers.

In the OLED display panel described in an embodiment of the present application, the light-absorbing material layer includes a plurality of pixel areas corresponding to the plurality of organic light-emitting monomers; and an absorbance of the light-absorbing material layer in the pixel areas for light with a wavelength of 380 nanometers to 700 nanometers is less than 95%.

In the OLED display panel described in an embodiment of the present application, the light-absorbing material layer includes a plurality of pixel areas corresponding to the plurality of organic light-emitting monomers; and the light-absorbing material layer further includes non-pixel areas corresponding to spacer areas of the plurality of organic light-emitting monomers; and an absorbance of the non-pixel areas is greater than an absorbance of the pixel areas.

In the OLED display panel described in an embodiment of the present application, the light-absorbing material layer includes a plurality of pixel areas corresponding to the plurality of organic light-emitting monomers; the light-absorbing material layer further includes non-pixel areas corresponding to spacer areas of the plurality of organic light-emitting monomers; and the substrate includes a first substrate area and a second substrate area;

wherein the color filter layer includes a first color filter area and a second color filter area; and wherein the first color filter area corresponds to the second substrate area, the second color filter area corresponds to the first substrate area, and the pixel areas and the non-pixel areas correspond to the first substrate area.

In the OLED display panel described in an embodiment of the present application, the light-absorbing material layer further includes a first area, and the first area corresponds to the first color filter area.

In the OLED display panel described in an embodiment of the present application, an absorbance of the light-absorbing material layer in the first area is greater than or equal to an absorbance of the light-absorbing material layer in the non-pixel areas.

In the OLED display panel described in an embodiment of the present application, a thickness of the light-absorbing material layer in the non-pixel areas is greater than a thickness of the light-absorbing material layer in the pixel areas.

In the OLED display panel described in an embodiment of the present application, the non-pixel areas protrude from the pixel areas to form a plurality of pixel holes on a side of the light-absorbing material layer facing away from the light exiting direction, and each of the pixel holes is provided with the organic light-emitting monomers.

In the OLED display panel described in an embodiment of the present application, the non-pixel areas are coated with a light-shielding material layer.

Another embodiment of the present application also provides an organic light-emitting diode (OLED) display panel, which includes:

a substrate;

an organic light-emitting layer disposed on the substrate, and provided with a plurality of organic light-emitting monomers;

a color filter layer disposed on a side of the organic light-emitting layer facing toward a light-exiting direction;

a light-absorbing material layer disposed on the side of the organic light-emitting layer facing toward a light-exiting direction, wherein the light-absorbing material layer includes a plurality of pixel areas corresponding to the plurality of organic light-emitting monomers;

a thickness of the light-absorbing material layer in the pixel areas is 50 nanometers to 2000 nanometers; and an absorbance of the light-absorbing material layer in the pixel areas for light with a wavelength of 380 nanometers to 700 nanometers is less than 95%.

In the OLED display panel described in an embodiment of the present application, the organic light-emitting layer includes a cathode metal layer, an anode metal layer, and a light-emitting layer located between the cathode metal layer and the anode metal layer; the light-emitting layer is formed of the plurality of organic light-emitting monomers; and the light-emitting layer emits light toward a side away from the substrate; and wherein the color filter layer is disposed on a side of the cathode metal layer away from the substrate, and the light-absorbing material layer is disposed on a side of the color filter layer away from the substrate.

In the OLED display panel described in an embodiment of the present application, the organic light-emitting layer includes a cathode metal layer, an anode metal layer, and a light-emitting layer located between the cathode metal layer and the anode metal layer; the light-emitting layer is formed of the plurality of organic light-emitting monomers; and the light-emitting layer emits light toward a side close to the substrate; and wherein the color filter layer is disposed on a side of the anode metal layer close to the substrate, and the light-absorbing material layer is disposed on a side of the color filter layer close to the substrate.

In the OLED display panel described in an embodiment of the present application, the light-absorbing material layer includes a plurality of pixel areas corresponding to the plurality of organic light-emitting monomers; and the light-absorbing material layer further includes non-pixel areas corresponding to spacer areas of the plurality of organic light-emitting monomers; and an absorbance of the non-pixel areas is greater than an absorbance of the pixel areas.

In the OLED display panel described in an embodiment of the present application, the light-absorbing material layer includes a plurality of pixel areas corresponding to the plurality of organic light-emitting monomers; the light-absorbing material layer further includes non-pixel areas corresponding to spacer areas of the plurality of organic light-emitting monomers; and the substrate includes a first substrate area and a second substrate area;

wherein the color filter layer includes a first color filter area and a second color filter area; and wherein the first color filter area corresponds to the second substrate area, the second color filter area corresponds to the first substrate area, and the pixel areas and the non-pixel areas correspond to the first substrate area.

In the OLED display panel described in an embodiment of the present application, the light-absorbing material layer further includes a first area, and the first area corresponds to the first color filter area.

In the OLED display panel described in an embodiment of the present application, an absorbance of the light-absorbing material layer in the first area is greater than or equal to an absorbance of the light-absorbing material layer in the non-pixel areas.

In the OLED display panel described in an embodiment of the present application, a thickness of the light-absorbing material layer in the non-pixel areas is greater than a thickness of the light-absorbing material layer in the pixel areas.

In view of above, in the OLED display panel and the OLED display device provided by the embodiments of the present application, by adopting a light-absorbing material layer in a light-exiting direction of the organic light-emitting layer to filter out reflected light of an anode metal layer of the organic light-emitting layer, a poor visual effect can be prevented even in places where ambient light is slightly strong, thereby improving user's experience.

BRIEF DESCRIPTION OF DRAWINGS

The following describes the specific implementations of the present application in detail with reference to the accompanying drawings, which will make the technical solutions and other beneficial effects of the present application obvious.

DETAILED DESCRIPTION OF PREFERRED EMBODIMENTS

The technical solutions in the embodiments of the present application will be clearly and completely described below in conjunction with the drawings in the embodiments of the present application.

The present application provides an organic light-emitting diode (OLED) display panel, including: a substrate; an organic light-emitting layer disposed on the substrate, and provided with a plurality of organic light-emitting monomers; a color filter layer disposed on a side of the organic light-emitting layer facing toward a light-exiting direction; and a light-absorbing material layer disposed on the side of the organic light-emitting layer facing toward a light-exiting direction. In the present application, by adopting a light-absorbing material layer in a light-exiting direction of the organic light-emitting layer to filter out reflected light of an anode metal layer of the organic light-emitting layer, a poor visual effect can be prevented even in places where ambient light is slightly strong, thereby improving user's experience.

Figure 1:
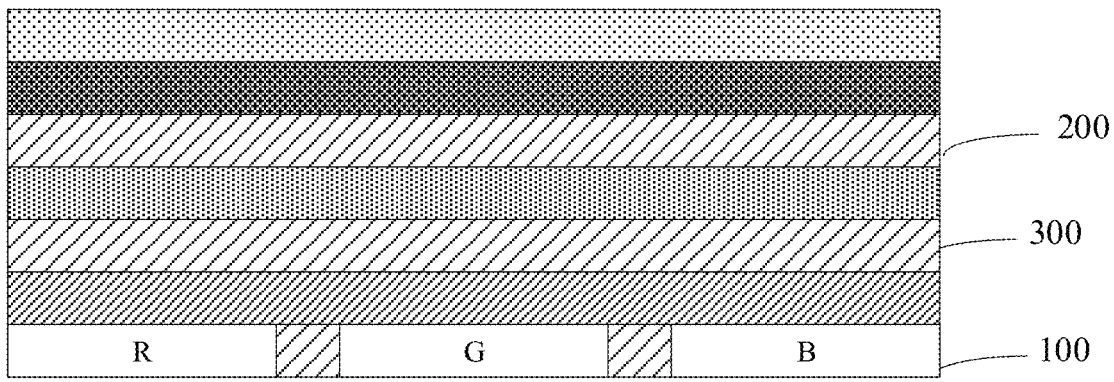
FIG. 1 is a schematic diagram of a structure of an organic light-emitting diode (OLED) display panel in the prior art.
Figure 2:
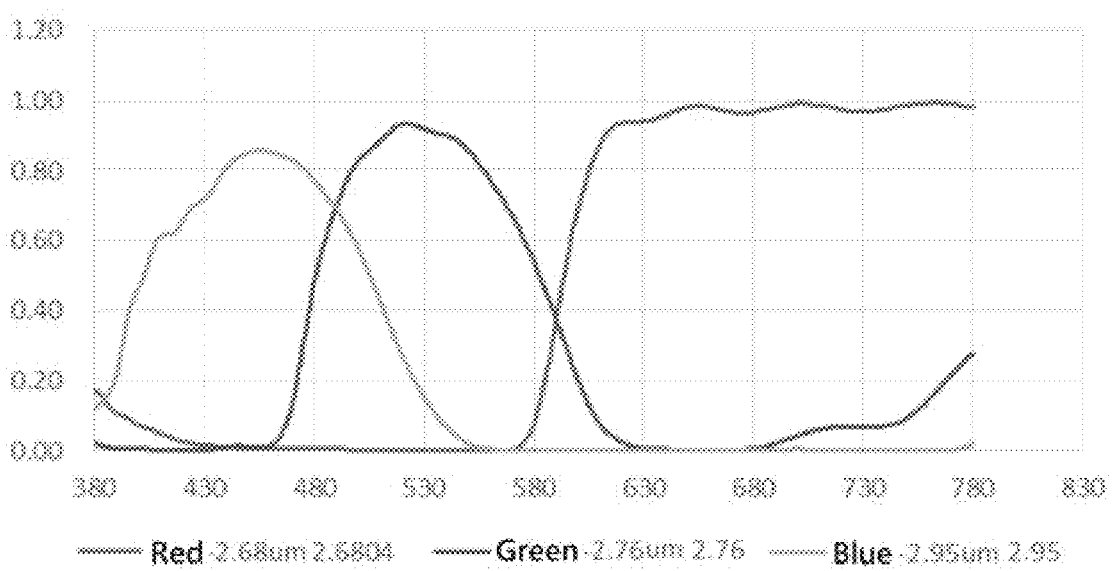
FIG. 2 is a spectrum diagram of transmitted light of a color filter layer in the prior art.

Referring to FIG. 1 in conjunction with FIG. 2, a light-absorbing material layer is employed to coat a color filter layer to achieve further absorption of reflected light. Since the color filter layer 100 itself has excellent light transmission performance for green light, blue light, and red light emitted by the organic light-emitting layer 200 and the organic light-emitting layer 300, after removing a polarizing film and adding the color filter, luminous brightness of an organic light-emitting diode (OLED) display panel will be increased by more than 60%, so that there is a sufficient level of brightness to use a light-absorbing material that absorbs all visible light bands.

Figure 3:
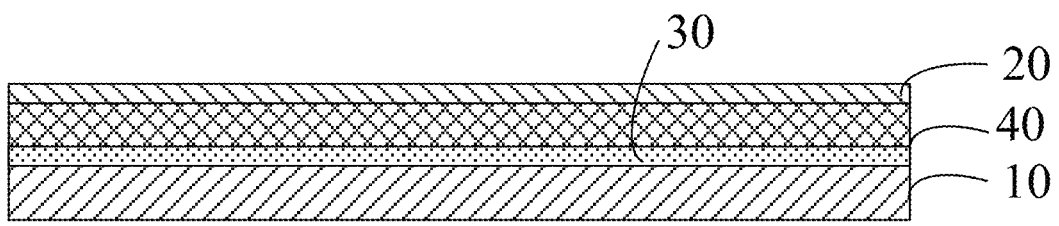
FIG. 3 is a schematic diagram of a first structure of an organic light-emitting diode (OLED) display panel in an embodiment of the present application.

Referring to FIG. 3, FIG. 3 is a schematic diagram of a first structure of an organic light-emitting diode (OLED) display panel in an embodiment of the present application. As shown in FIG. 3, the OLED display panel includes: a substrate 10, an organic light-emitting layer 20, a light-absorbing material layer 30, and a color filter layer 40.

The OLED display panel in an embodiment of the present application is a bottom light-emitting type OLED display panel. That is, the OLED display panel of an embodiment of the present application emits light toward a side close to the substrate 10. Specifically, the organic light-emitting layer 20 is disposed on the substrate 10; the color filter layer 40 is disposed in a light-exiting direction of the organic light-emitting layer 20; and the light-absorbing material layer 30 is disposed in the light-exiting direction of the organic light-emitting layer 20. In an embodiment of the present application, the substrate 10, the light-absorbing material layer 30, the color filter layer 40, and the organic light-emitting layer 20 are stacked in sequence.

Specifically, the substrate 10 includes a substrate body and a TFT array layer disposed on the substrate body. The substrate body may be a transparent glass substrate or a transparent PV material substrate. The organic light-emitting layer 20 has a same structure as the organic light-emitting layer in the prior art, and includes an anode metal layer, an electron injection layer, an electron transport layer, a light-emitting layer, a hole transport layer, a hole injection layer, and a cathode metal layer, which belong to the prior art, and details will not be described herein for brevity. The color filter layer 40 may be a quantum dot color filter layer. In some embodiments, the color filter layer 40 may also be a conventional color filter layer.

Figure 4:
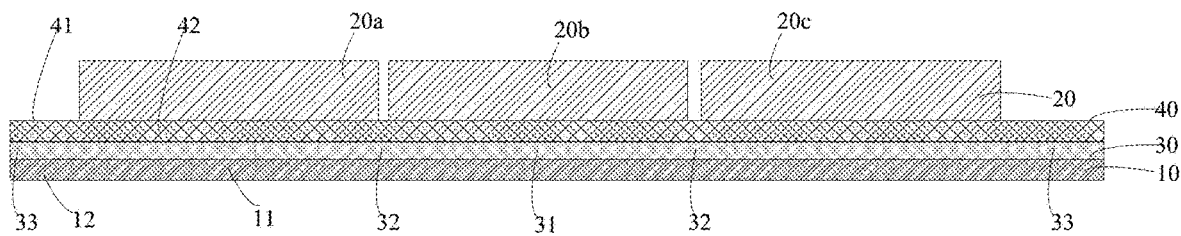
FIG. 4 is a schematic diagram of a second structure of the OLED display panel in an embodiment of the present application.

In some embodiments, referring to FIG. 4, FIG. 4 is a schematic diagram of a second structure of an organic light-emitting diode (OLED) display panel in an embodiment of the present application. As shown in FIG. 4, the substrate 10 includes a first substrate area 11 and a second substrate area 12. The light-absorbing material layer 30 includes pixel areas 31, non-pixel areas 32, and a first area. The color filter layer 40 includes a first color filter area 41 and a second color filter area 42.

The light-emitting layer includes a plurality of organic light-emitting monomers distributed in an array at intervals. The plurality of organic light-emitting monomers include blue organic light-emitting monomers 20a, green organic light-emitting monomers 20b, and red organic light-emitting monomers 20c.

It should be noted that the organic light-emitting layer 20 includes a cathode metal layer, an anode metal layer, and a light-emitting layer located between the cathode metal layer and the anode metal layer; the light-emitting layer is formed of a plurality of organic light-emitting monomers; and the light-emitting layer faces away from the substrate, wherein the color filter layer is arranged on a side of the cathode metal layer away from the substrate, and the light-absorbing material layer is arranged on the side of the color filter layer away from the substrate.

The plurality of pixel areas 31 are arranged corresponding to the plurality of organic light-emitting monomers. The non-pixel areas 32 are arranged corresponding to spacer areas of the plurality of organic light-emitting monomers. The first color filter area 41 is disposed corresponding to the second substrate area 12 of the substrate 10 and the first area 33 of the light-absorbing material layer 30. That is, the first color filter area 41 is arranged corresponding to the TFT array layer for shielding thin film transistors and metal traces of the TFT array layer. The second color filter area 42 is arranged corresponding to the first substrate area of the substrate. The pixel areas 31 and the non-pixel areas 32 are arranged corresponding to the first substrate area of the substrate.

Specifically, a thickness of the light-absorbing material layer 30 in the pixel area 31 is 50 nanometers to 2000 nanometers. A light absorbance of the light-absorbing material layer in the pixel areas for light with a wavelength of 380 nanometers to 700 nanometers is less than 95%. In addition, the light absorbance of the light-absorbing material layer 30 in the pixel areas is lower than the light absorbance of the light-absorbing material layer 30 in the non-pixel area, so as to better absorb light reflected by the metal traces in the space areas.

Of course, there are many ways to realize the light absorbance of the light-absorbing material layer in the pixel areas 31 being lower than the light absorbance of the light-absorbing material layer in the non-pixel area. In some embodiments, the thickness of the pixel areas 31 is less than the thickness of the non-pixel area. In some embodiments, the non-pixel areas 32 are coated with a light-shielding material layer. Alternatively, in some embodiments, the thickness of the pixel areas 31 is less than the thickness of the non-pixel area, and the non-pixel areas 32 are coated with a light-shielding material layer.

Figure 5:
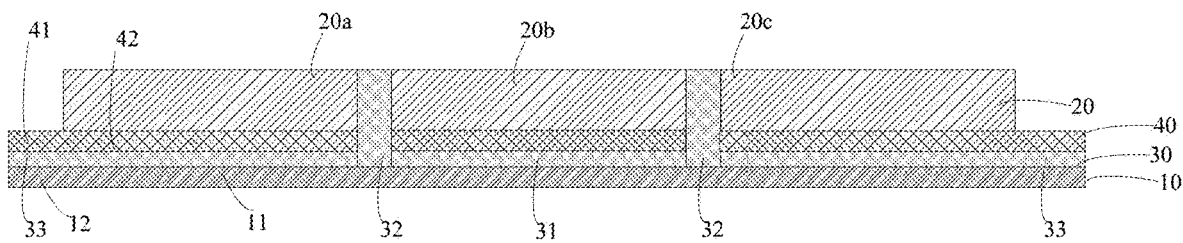
FIG. 5 is a schematic diagram of a third structure of the OLED display panel in an embodiment of the present application.

In some embodiments, referring to FIG. 5, FIG. 5 is a schematic diagram of a third structure of an organic light-emitting diode (OLED) display panel in an embodiment of the present application. As shown in FIG. 5, a thickness of pixel areas 31 is less than a thickness of non-pixel areas 32. Specifically, on the side of the light-absorbing material layer 30 facing away from the light-exiting direction, that is, on the side away from the substrate 10, the non-pixel areas 32 protrude from the pixel areas 31 to form a plurality of pixel holes, and each of the pixel holes is provided with the organic light-emitting monomers. The plurality of organic light-emitting monomers of the organic light-emitting layer include blue organic light-emitting monomers 20a, green organic light-emitting monomers 20b, and red organic light-emitting monomers 20c. Specifically, in the manufacturing process, the pixel areas are thinned by a photolithography process to obtain a plurality of pixel holes, so that there is no need to provide a black matrix, which can reduce the process steps, improve efficiency, and reduce costs.

Of course, it is appreciated that in some embodiments, the non-pixel areas 32 can also be coated with a light-shielding material layer to increase light absorbance of the non-pixel areas.

In view of above, in the OLED display panel and the OLED display device provided by the embodiments of the present application, by adopting a light-absorbing material layer in a light-exiting direction of the organic light-emitting layer to filter out reflected light of an anode metal layer of the organic light-emitting layer, a poor visual effect can be prevented even in places where ambient light is slightly strong, thereby improving user's experience.

Figure 6:
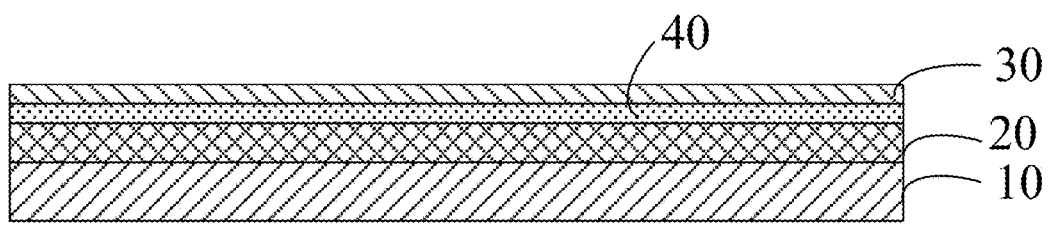
FIG. 6 is a schematic diagram of a fourth structure of the OLED display panel in an embodiment of the present application.

Referring to FIG. 6, FIG. 6 is a schematic diagram of a fourth structure of an organic light-emitting diode (OLED) display panel in an embodiment of the present application. The OLED display panel includes a substrate 10, an organic light-emitting layer 20, a light-absorbing material layer 30, and a color filter layer 40.

The OLED display panel in this embodiment is a top light-emitting OLED display panel. That is, the OLED display panel of an embodiment of the present application emits light toward a side away from the substrate 10. Specifically, the organic light-emitting layer is arranged on the substrate; the color filter layer is arranged in a light-exiting direction of the organic light-emitting layer; and the light-absorbing material layer is arranged in the light-exiting direction of the organic light-emitting layer. In an embodiment of the present application, the substrate 10, the organic light-emitting layer 20, the color filter layer 40, and the light-absorbing material layer 30 are stacked in sequence.

Specifically, the substrate 10 includes a substrate body and a TFT array layer disposed on the substrate body. The substrate body may be a transparent glass substrate or a transparent PV material substrate. The organic light-emitting layer 20 has a same structure as the organic light-emitting layer in the prior art, and includes an anode metal layer, an electron injection layer, an electron transport layer, a light-emitting layer, a hole transport layer, a hole injection layer, and a cathode metal layer, which belong to the prior art, and details will not be described herein for brevity. The color filter layer 40 may be a quantum dot color filter layer. In some embodiments, the color filter layer 40 may also be a conventional color filter layer.

Figure 7:
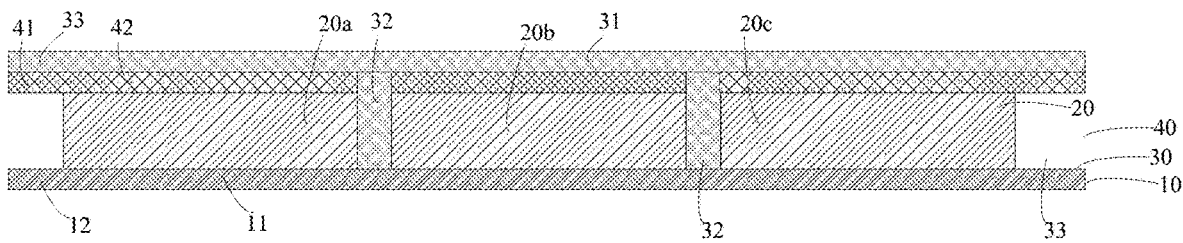
FIG. 7 is a schematic diagram of a fifth structure of the OLED display panel in an embodiment of the present application.

In some embodiments, referring to FIG. 7, FIG. 7 is a schematic diagram of a fifth structure of the OLED display panel in the embodiments of the present application. As shown in FIG. 7, the substrate 10 includes a first substrate area 11 and a second substrate area 12. The light-absorbing material layer 30 includes pixel areas 31, pixel areas 32, and a first area. The color filter layer 40 includes a first color filter area 41 and a second color filter area 42.

The light-emitting layer includes a plurality of organic light-emitting monomers distributed in an array at intervals. The plurality of organic light-emitting monomers include blue organic light-emitting monomers 20a, green organic light-emitting monomers 20b, and red organic light-emitting monomers 20c.

It should be noted that the organic light-emitting layer 20 includes a cathode metal layer, an anode metal layer, and a light-emitting layer located between the cathode metal layer and the anode metal layer; the light-emitting layer is formed of a plurality of organic light-emitting monomers; and the light-emitting layer faces away from the substrate, wherein the color filter layer is arranged on a side of the cathode metal layer away from the substrate, and the light-absorbing material layer is arranged on the side of the color filter layer away from the substrate.

The plurality of pixel areas 31 are arranged corresponding to the plurality of organic light-emitting monomers. The non-pixel areas 32 are arranged corresponding to spacer areas of the plurality of organic light-emitting monomers. The first color filter area 41 is disposed corresponding to the second substrate area 12 of the substrate 10 and the first area 33 of the light-absorbing material layer 30. That is, the first color filter area 41 is arranged corresponding to the TFT array layer for shielding thin film transistors and metal traces of the TFT array layer. The second color filter area 42 is arranged corresponding to the first substrate area of the substrate. The pixel areas 31 and the non-pixel areas 32 are arranged corresponding to the first substrate area of the substrate.

Specifically, a thickness of the light-absorbing material layer 30 in the pixel area 31 is 50 nanometers to 2000 nanometers. A light absorbance of the light-absorbing material layer in the pixel areas for light with a wavelength of 380 nanometers to 700 nanometers is less than 95%. In addition, the light absorbance of the light-absorbing material layer 30 in the pixel areas is lower than the light absorbance of the light-absorbing material layer 30 in the non-pixel area, so as to better absorb light reflected by the metal traces in the space areas.

Of course, there are many ways to realize the light absorbance of the light-absorbing material layer in the pixel areas 31 being lower than the light absorbance of the light-absorbing material layer in the non-pixel area. In some embodiments, the thickness of the pixel areas 31 is less than the thickness of the non-pixel area. In some embodiments, the non-pixel areas 32 are coated with a light-shielding material layer. Alternatively, in some embodiments, the thickness of the pixel areas 31 is less than the thickness of the non-pixel area, and the non-pixel areas 32 are coated with a light-shielding material layer.

Further, a thickness of pixel areas 31 is less than a thickness of non-pixel areas 32. Specifically, on the side of the light-absorbing material layer 30 facing away from the light-exiting direction, that is, on the side away from the substrate 10, the non-pixel areas 32 protrude from the pixel areas 31 to form a plurality of pixel holes, and each of the pixel holes is provided with the organic light-emitting monomers. The plurality of organic light-emitting monomers of the organic light-emitting layer include blue organic light-emitting monomers 20a, green organic light-emitting monomers 20b, and red organic light-emitting monomers 20c. Specifically, in the manufacturing process, the pixel areas are thinned by a photolithography process to obtain a plurality of pixel holes, so that there is no need to provide a black matrix, which can reduce the process steps, improve efficiency, and reduce costs.

Of course, it is appreciated that in some embodiments, the non-pixel areas 32 can also be coated with a light-shielding material layer to increase light absorbance of the non-pixel areas.

In view of above, in the OLED display panel and the OLED display device provided by the embodiments of the present application, by adopting a light-absorbing material layer in a light-exiting direction of the organic light-emitting layer to filter out reflected light of an anode metal layer of the organic light-emitting layer, a poor visual effect can be prevented even in places where ambient light is slightly strong, thereby improving user's experience.

The above descriptions are only examples of the present application and are not used to limit the protection scope of the present application. For those skilled in the art, the present application can have various modifications and changes. Any modification, equivalent replacement, improvement, etc. made within the spirit and principle of the present application shall be included in the protection scope of the present application.

What is claimed is:

1. An organic light-emitting diode (OLED) display panel, comprising:
    a substrate;
    an organic light-emitting layer disposed on the substrate, and provided with a plurality of organic light-emitting monomers;
    a color filter layer disposed on a side of the organic light-emitting layer facing toward a light-exiting direction; and
    a light-absorbing material layer disposed on the side of the organic light-emitting layer facing toward the light-exiting direction;
    wherein the light-absorbing material layer comprises a plurality of second areas corresponding to a plurality of pixel areas of the plurality of organic light-emitting monomers; and the light-absorbing material layer further comprises a plurality of third areas corresponding to a plurality of non-pixel areas of spacer areas of the plurality of organic light-emitting monomers; and
    wherein on a side of the light-absorbing material layer facing away from the light-exiting direction, the plurality of third areas protrude from the plurality of second areas to separate the plurality of organic light-emitting monomers.

2. The OLED display panel according to claim 1, wherein the organic light-emitting layer comprises a cathode metal layer, an anode metal layer, and a light-emitting layer located between the cathode metal layer and the anode metal layer; the light-emitting layer is formed of the plurality of organic light-emitting monomers; and the light-emitting layer emits light toward a side away from the substrate; and
    wherein the color filter layer is disposed on a side of the cathode metal layer away from the substrate, and the light-absorbing material layer is disposed on a side of the color filter layer away from the substrate.

3. The OLED display panel according to claim 1, wherein the organic light-emitting layer comprises a cathode metal layer, an anode metal layer, and a light-emitting layer located between the cathode metal layer and the anode metal layer; the light-emitting layer is formed of the plurality of organic light-emitting monomers; and the light-emitting layer emits light toward a side close to the substrate; and
    wherein the color filter layer is disposed on a side of the anode metal layer close to the substrate, and the light-absorbing material layer is disposed on a side of the color filter layer close to the substrate.

4. The OLED display panel according to claim 1, wherein a thickness of the light-absorbing material layer in the pixel areas is 50 nanometers to 2000 nanometers.

5. The OLED display panel according to claim 1, wherein an absorbance of the light-absorbing material layer in the pixel areas for light with a wavelength of 380 nanometers to 700 nanometers is less than 95%.

6. The OLED display panel according to claim 1, wherein an absorbance of the non-pixel areas is greater than an absorbance of the pixel areas.

7. The OLED display panel according to claim 1, wherein the substrate comprises a first substrate area and a second substrate area;
    wherein the color filter layer comprises a first color filter area and a second color filter area; and
    wherein the first color filter area corresponds to the second substrate area, the second color filter area corresponds to the first substrate area, and the pixel areas and the non-pixel areas correspond to the first substrate area.

8. The OLED display panel according to claim 7, wherein the light-absorbing material layer further comprises a first area, and the first area corresponds to the first color filter area.

9. The OLED display panel according to claim 8, wherein an absorbance of the light-absorbing material layer in the first area is greater than or equal to an absorbance of the light-absorbing material layer in the non-pixel areas.

10. The OLED display panel according to claim 7, wherein a thickness of the light-absorbing material layer in the third areas is greater than a thickness of the light-absorbing material layer in the second areas.

11. The OLED display panel according to claim 7, wherein the third areas protrude from the pixel areas to form a plurality of pixel holes on a side of the light-absorbing material layer facing away from the light exiting direction, and each of the pixel holes is provided with the organic light-emitting monomers.

12. The OLED display panel according to claim 7, wherein the third areas are coated with a light-shielding material layer.

13. An organic light-emitting diode (OLED) display panel, comprising:
    a substrate;
    an organic light-emitting layer disposed on the substrate, and provided with a plurality of organic light-emitting monomers;
    a color filter layer disposed on a side of the organic light-emitting layer facing toward a light-exiting direction; and
    a light-absorbing material layer disposed on the side of the organic light-emitting layer facing toward the light-exiting direction,
    wherein the light-absorbing material layer comprises a plurality of second areas corresponding to a plurality of pixel areas of the plurality of organic light-emitting monomers, and the light-absorbing material layer further comprises a plurality of third areas corresponding to a plurality of non-pixel areas of spacer areas of the plurality of organic light-emitting monomers;
    wherein on a side of the light-absorbing material layer facing away from the light-exiting direction, the plurality of third areas protrude from the plurality of second areas to separate the plurality of organic light-emitting monomers;
    wherein a thickness of the light-absorbing material layer in the pixel areas is 50 nanometers to 2000 nanometers; and
    wherein an absorbance of the light-absorbing material layer in the pixel areas for light with a wavelength of 380 nanometers to 700 nanometers is less than 95%.

14. The OLED display panel according to claim 13, wherein the organic light-emitting layer comprises a cathode metal layer, an anode metal layer, and a light-emitting layer located between the cathode metal layer and the anode metal layer; the light-emitting layer is formed of the plurality of organic light-emitting monomers; and the light-emitting layer emits light toward a side away from the substrate; and
    wherein the color filter layer is disposed on a side of the cathode metal layer away from the substrate, and the light-absorbing material layer is disposed on a side of the color filter layer away from the substrate.

15. The OLED display panel according to claim 13, wherein the organic light-emitting layer comprises a cathode metal layer, an anode metal layer, and a light-emitting layer located between the cathode metal layer and the anode metal layer; the light-emitting layer is formed of the plurality of organic light-emitting monomers; and the light-emitting layer emits light toward a side close to the substrate; and
    wherein the color filter layer is disposed on a side of the anode metal layer close to the substrate, and the light-absorbing material layer is disposed on a side of the color filter layer close to the substrate.

16. The OLED display panel according to claim 13, wherein
    an absorbance of the non-pixel areas is greater than an absorbance of the pixel areas.

17. The OLED display panel according to claim 13, wherein the substrate comprises a first substrate area and a second substrate area;
    wherein the color filter layer comprises a first color filter area and a second color filter area; and
    wherein the first color filter area corresponds to the second substrate area, the second color filter area corresponds to the first substrate area, and the pixel areas and the non-pixel areas correspond to the first substrate area.

18. The OLED display panel according to claim 17, wherein the light-absorbing material layer further comprises a first area, and the first area corresponds to the first color filter area.

19. The OLED display panel according to claim 18, wherein an absorbance of the light-absorbing material layer in the first area is greater than or equal to an absorbance of the light-absorbing material layer in the third areas.

20. The OLED display panel according to claim 17, wherein a thickness of the light-absorbing material layer in the third areas is greater than the thickness of the light-absorbing material layer in the second areas.

* * * * *